(12) United States Patent
Basin et al.

(10) Patent No.: US 7,867,793 B2
(45) Date of Patent: Jan. 11, 2011

(54) SUBSTRATE REMOVAL DURING LED FORMATION

(75) Inventors: Grigoriy Basin, San Francisco, CA (US); Robert S. West, Morgan Hill, CA (US); Paul S. Martin, Pleasanton, CA (US)

(73) Assignees: Koninklijke Philips Electronics N.V., Eindhoven (NL); Philips Lumileds Lighting Company LLC, San Jose, CA (US)

(*) Notice: Subject to any disclaimer, the term of this patent is extended or adjusted under 35 U.S.C. 154(b) by 332 days.

(21) Appl. No.: 11/775,059

(22) Filed: Jul. 9, 2007

(65) Prior Publication Data
US 2009/0017566 A1 Jan. 15, 2009

(51) Int. Cl.
*H01L 21/00* (2006.01)
(52) U.S. Cl. ............. 438/26; 438/22; 257/E21.056
(58) Field of Classification Search ......... 257/758, 257/98; 438/108, 106, 127, 26
See application file for complete search history.

(56) References Cited

U.S. PATENT DOCUMENTS

| | | | |
|---|---|---|---|
| 5,128,746 | A | 7/1992 | Pennisi et al. |
| 6,245,595 | B1 | 6/2001 | Nguyen et al. |
| 6,352,881 | B1 | 3/2002 | Nguyen et al. |
| 6,399,426 | B1 | 6/2002 | Capte et al. |
| 6,838,311 | B2 * | 1/2005 | Fang ............ 438/106 |
| 6,869,832 | B2 | 3/2005 | Stecher |
| 6,943,061 | B1 | 9/2005 | Sirinorakul et al. |
| 2003/0148024 | A1 * | 8/2003 | Kodas et al. ......... 427/125 |
| 2005/0012208 | A1 | 1/2005 | Jang et al. |
| 2005/0161779 | A1 | 7/2005 | Peng et al. |
| 2006/0043402 | A1 | 3/2006 | Suehiro et al. |
| 2006/0281203 | A1 * | 12/2006 | Epler et al. ............ 438/22 |
| 2007/0096130 | A1 | 5/2007 | Schiaffino et al. |

FOREIGN PATENT DOCUMENTS

| | | |
|---|---|---|
| EP | 1653523 A2 | 3/2006 |
| EP | 1653523 A3 | 5/2006 |
| JP | 2002271014 | 9/2002 |
| WO | 0147039 A1 | 6/2001 |
| WO | 2005062905 A2 | 7/2005 |
| WO | 2006131843 A2 | 12/2006 |
| WO | 2007009042 A1 | 1/2007 |
| WO | 2008007235 A2 | 1/2008 |
| WO | 2008038249 A2 | 4/2008 |

* cited by examiner

*Primary Examiner*—Thanh V Pham
*Assistant Examiner*—Mark A Laurenzi, III (57) ABSTRACT

A light emitting diode (LED) is fabricated using an underfill layer that is deposited on either the LED or the submount prior to mounting the LED to a submount. The deposition of the underfill layer prior to mounting the LED to the submount provides for a more uniform and void free support, and increases underfill material options to permit improved thermal characteristics. The underfill layer may be used as support for the thin and brittle LED layers during the removal of the growth substrate prior to mounting the LED to the submount. Additionally, the underfill layer may be patterned to and/or polished back so that only the contact areas of the LED and/or submount are exposed. The patterns in the underfill may also be used as a guide to assist in the singulating of the devices.

18 Claims, 8 Drawing Sheets

SUBSTRATE REMOVAL DURING LED FORMATION

FIELD OF THE INVENTION

The present invention is related to the fabrication of a light emitting diode.

BACKGROUND

Semiconductor light-emitting diodes (LEDs) are among the most efficient light sources currently available. Materials systems currently of interest in the manufacture of high-brightness light emitting devices capable of operation across the visible spectrum include Group III-V semiconductors; for example, binary, ternary, and quaternary alloys of gallium, aluminum, indium, nitrogen, phosphorus, and arsenic. III-V devices emit light across the visible spectrum. GaAs- and GaP-based devices are often used to emit light at longer wavelengths such as yellow through red, while III-nitride devices are often used to emit light at shorter wavelengths such as near-UV through green.

Gallium nitride LEDs typically use a transparent sapphire growth substrate due to the crystal structure of sapphire being similar to the crystal structure of gallium nitride.

Some GaN LEDs are formed as flip chips, with both electrodes on the same surface, where the LED electrodes are bonded to electrodes on a submount without using wire bonds. A submount provides an interface between the LED and an external power supply. Electrodes on the submount bonded to the LED electrodes may extend beyond the LED or extend to the opposite side of the submount for wire bonding or surface mounting to a circuit board.

FIGS. 1A-1D are simplified cross-sectional views of the process of mounting GaN LEDs 10 to a submount 12 and removing the sapphire growth substrate 24. The submount 12 may be formed of silicon or may be a ceramic insulator. If the submount 12 is silicon, an oxide layer may insulate the metal pattern on the submount surface from the silicon, or different schemes of ion implantation can be realized for added functionality such as electrostatic discharge protection.

Figure 1A:
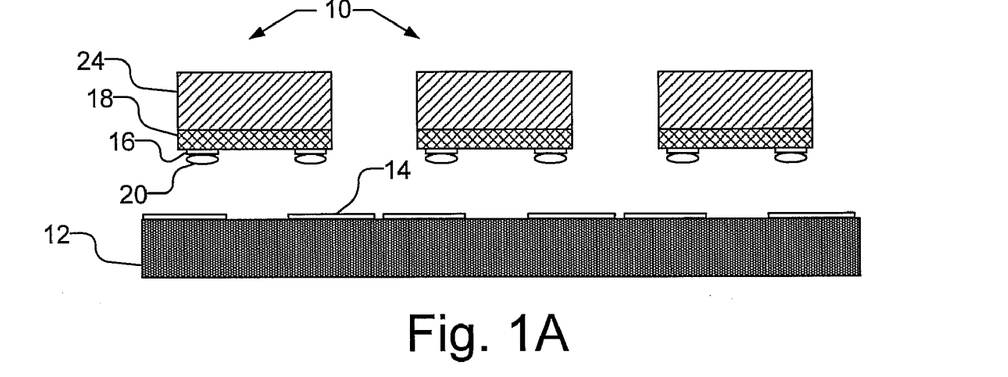
FIGS. 1A-1D are simplified cross-sectional views of the process of mounting LEDs to a submount, followed by injecting an underfill and removing the sapphire growth substrate.

As can be seen in FIG. 1A, a number of LED dies 10 are formed with a thin GaN LED layer 18 formed on a sapphire growth substrate 24. Electrodes 16 are formed in electrical contact with the n-type and p-type layers in the GaN layer 18. Gold stud bumps 20 are placed on the electrodes 16 on the LEDs 10 or alternatively on the metal pads 14 on the submount 12. The gold stud bumps 20 are generally spherical gold balls placed at various points between the LED electrodes 16 and the submount metal pads 14. The LED layers 18 and electrodes 16 are all formed on the same sapphire substrate 24, which is then diced to form the individual LED dies 10.

Figure 1B:
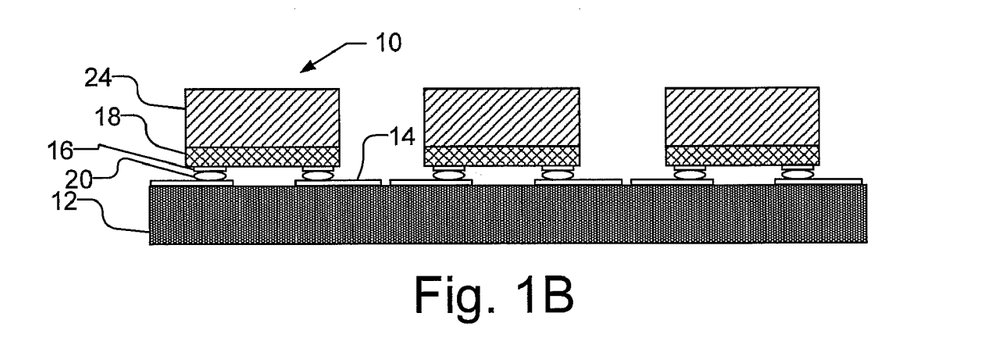

As illustrated in FIG. 1B, the LEDs 10 are bonded to the substrate 12 with the metal pads 14 on the submount 12 electrically bonded to the metal electrodes 16 on the GaN layers 18. Pressure is applied to the LED structure while an ultrasonic transducer rapidly vibrates the LED structure with respect to the submount to create heat at the interface. This causes the surface of the gold stud bumps to interdiffuse at the atomic level into the LED electrodes and submount electrodes to create a permanent electrical connection. Other types of bonding methods include soldering, applying a conductive paste, and other means.

Figure 1C:
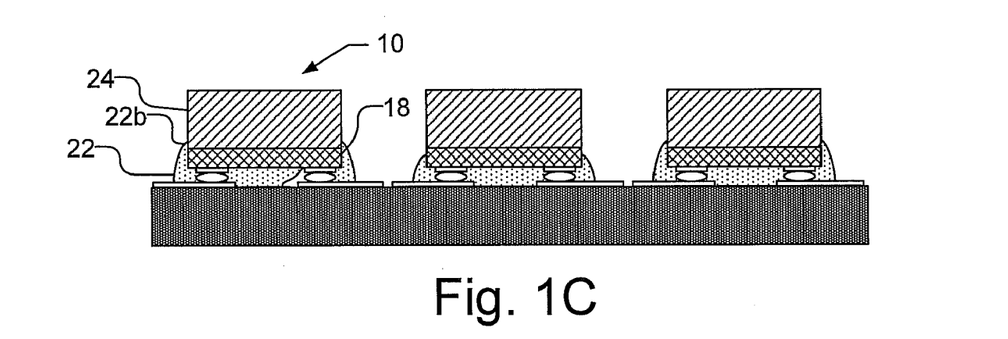

Between the LED layers 18 and the surface of the submount 12 there is a large void that is filled with an epoxy to provide mechanical support and to seal the area, as illustrated in FIG. 1C. The resulting epoxy is referred to as an underfill 22. Underfilling is very time-consuming since each LED dies 10 must be underfilled separately, and a precise amount of underfill material needs to be injected. The underfill material must be a low enough viscosity that it can flow under the LED dies 10, which may include a complicated geometry of electrodes, without trapping any bubbles that could result in poorly supported regions, as illustrated as region 22a. The underfill material, however, must not spread in an uncontrolled fashion onto undesirable surfaces, such as the top of the LED device, as illustrated at 22b, or pads on the submount where wire bonds must be subsequently applied.

Figure 1D:
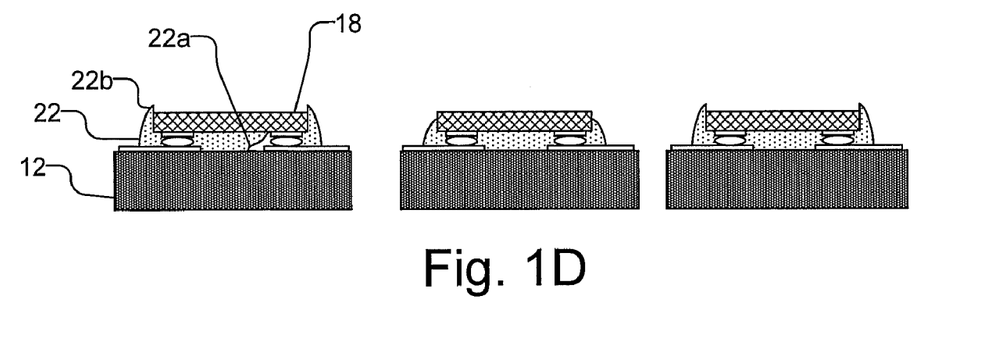

The sapphire substrates 24 are removed after the LED dies 10 are bonded to the submount 12 and the submount 12 is separated into individual elements to form the LED structures illustrated in FIG. 1D. Since the LED layers 18 are very thin and brittle, the underfill serves the additional purpose to provide the necessary mechanical support to prevent fracturing of the fragile LED layers when the supporting substrate 24 is removed. The gold stud bumps 20 do not provide sufficient support by themselves to prevent fracturing of the LED layers since, given their limited shape and are spaced far apart. Conventionally used underfill materials are typically composed of organic substances and possess very different thermal expansion properties from metal and semiconductor materials. Such spurious expansion behavior is particularly aggravated at high operating temperatures—typical of high power LED applications—where underfill materials approach their glass transition point and begin to behave as elastic substances. The net effect of such mismatch in thermal expansion behavior is to induce stresses on the LED devices that limit or reduce their operability at high power conditions. Lastly, underfill materials have low thermal conductivity properties that result in unnecessarily high temperature operation for the semiconductor devices.

What are needed are techniques for mechanically supporting the thin LED layers during a substrate removal process which provides a more uniform and void free support; provides support with more closely matched thermal expansion behavior, provide a support with high temperature operability, not limited by the glass transition point of organic materials; and provides a support with improved thermal conductivity for superior heat sinking.

SUMMARY

A light emitting diode (LED) is fabricated using an underfill layer that is deposited on either the LED or the submount prior to mounting the LED to a submount. The deposition of the underfill layer prior to mounting the LED to the submount provides for a more uniform and void free support, and increases underfill material options to permit improved thermal characteristics. In one embodiment, the underfill layer may be deposited on the LEDs and used support for the thin and brittle LED layers during the removal of the growth substrate. The growth substrate can then be removed at the wafer level prior to mounting the LED to the submount. In other embodiments, the underfill layer may be patterned and/or polished back so that only the contact areas of the LED and/or submount are exposed. The LEDs and submount can then be bonded with the underfill layer between them. The patterned underfill layer may also be used as a guide to assist in the singulating of the devices.

DETAILED DESCRIPTION

FIGS. 2A-2E are simplified cross-sectional views of a process of mounting GaN LEDs to a submount and removing the growth substrate in accordance with one embodiment of the present invention.

Figure 2A:
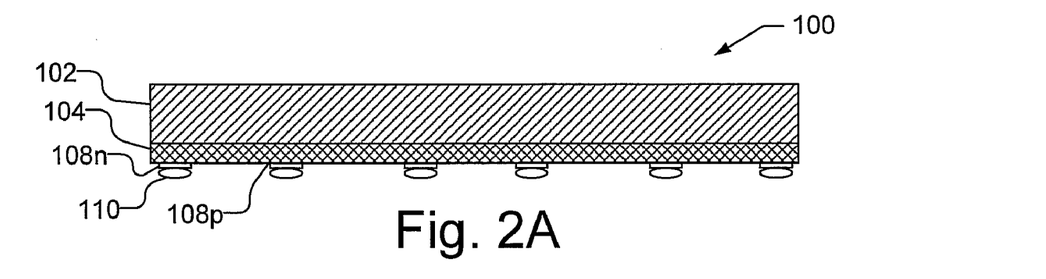
FIGS. 2A-2E are simplified cross-sectional views of a process of removing the growth substrate from LEDs on the wafer level and mounting the LEDs to a submount in accordance with one embodiment of the present invention.
Figure 2B:
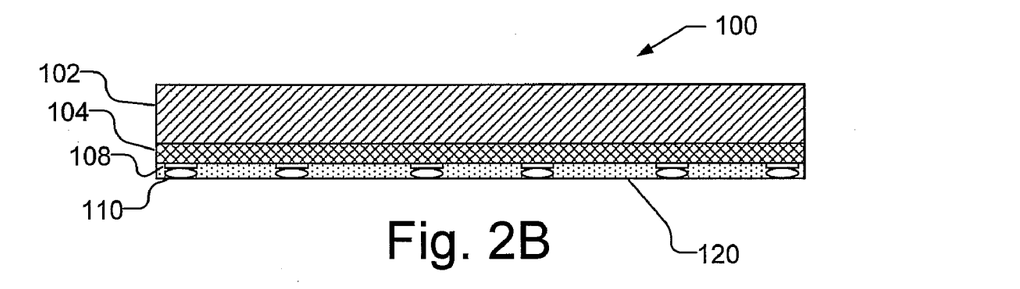
Figure 3:
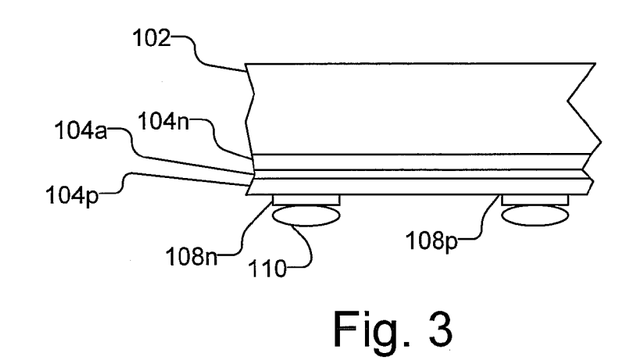
FIG. 3 illustrates a portion of the LED structure including a sapphire growth substrate and GaN layers.

FIG. 2A illustrates a portion of a wafer level LED structure 100 including a growth substrate 102, which may be, e.g., sapphire, upon which has been formed the thin GaN LED layers 104. The GaN LED layers 104 may be conventionally grown on the sapphire substrate, as described, e.g., in U.S. Publication No. 2007/0096130, which is incorporated herein by reference. FIG. 3 illustrates a portion of the wafer structure 100 including a sapphire substrate 102 over which an n-type GaN layer 104n is grown using conventional techniques. The GaN layer 104n may be multiple layers including a clad layer. The GaN layer 104n may include Al, In, and an n-type dopant. An active layer 104a is then grown over the GaN layer 104n. The active layer 104n will typically be multiple GaN-based layers and its composition (e.g., $In_xAl_yGa_{1-x-y}N$) depends on the desired wavelength of the light emission and other factors. The active layer 104a may be conventional. A p-type GaN layer 104p is then grown over the active layer 104a. The GaN layer 104p may be multiple layers including a clad layer and may also be conventional. The GaN layer 104p may include Al, In, and a p-type dopant. The LED structure of FIG. 3 is referred to as a double heterostructure.

In one embodiment, the growth substrate is about 90 microns thick, and the GaN layers 104 have a combined thickness of approximately 4 microns.

Although a GaN based LED with a sapphire growth substrate is used in the example, other types of LEDs using other substrates such as SiC (used to form an InAlGaN LED) and GaAs (used to form an AlInGaP LED) may benefit from the present invention.

Metal bonding layers are formed over the wafer to form n-contacts 108n and p-contacts 108p, referred to herein as contacts 108. The contacts 108 may be patterned by forming a masking layer at positions where the metal contacts are not desired, then depositing the metal contact layer over the entire wafer, and then stripping the masking layer to lift off the metal deposited over it. The metal layers could also be negatively patterned by depositing similarly stacked blanket metal layers and then selectively etching them back using a masking scheme. The contacts may be formed from one or more metals, such as TiAu, Au, Cu, Al, Ni or other ductile material, or a combination of such layers. Stud bumps 110, which may be, e.g., gold, are then formed over the contacts 108. The stud bumps 110 are generally spherical gold balls placed at various points on the contact 108. The stud bumps 110 serve as part of the contacts for the LED and are used to bond the LED to a submount. If desired, other types of bonding material or structures such as plates may be used in place of stud bumps 110.

As illustrated in FIG. 2, the underfill 120 is then deposited over the GaN layers 104, contacts 108 and bumps 110. Because the underfill 120 is applied prior to bonding the LEDs to a submount, any suitable material may be used for the underfill 120 without depending on the flow characteristics that are needed in the case of traditional underfill. For example, a polymer polyimide based materials, which have high glass transition temperature, may be used as the underfill layer 120. With the use of polyimide material, a solvent may be used to adjust the viscosity to 400-1000 Pa*s to assist in the deposition of the material. A filler powder, such as small particle $SiO_2$, may be added to the polyimide material, e.g., in the amount of 50% to 90%) in order to match the CTE (coefficient of thermal expansion). During deposition, the LEDs and polyimide material may be heated below the glass transition temperature, and then allowed to cool down to cure. Such materials will help the device withstand high temperature/high current condition without deformation of thin LEDs. The underfill material may be a bi-stage cured material, using a low temperature cure for cross-linking of additives, e.g., epoxy additives, in the underfill material that are responsible for the first stage cure. The underfill material should have B-stage cure properties in order to adhere to both LED and support wafer surfaces.

Figure 4A:
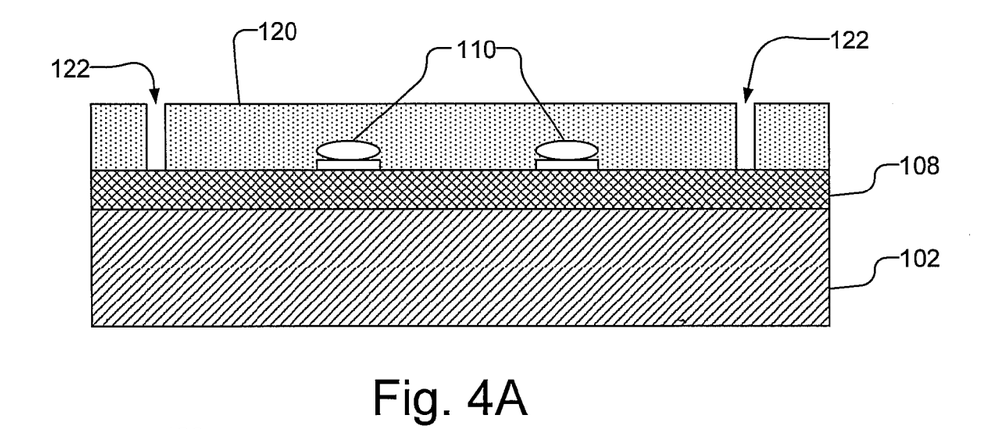
FIGS. 4A and 4B illustrate the deposition of the underfill material over a portion of the LEDs at the wafer level.
Figure 4B:
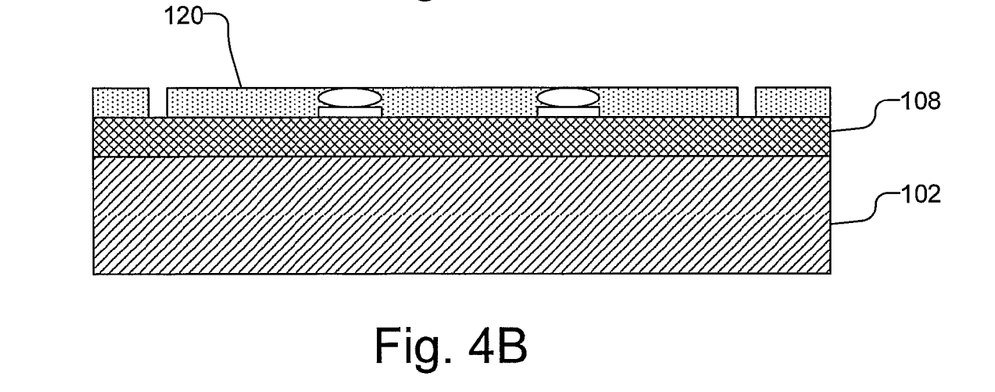

FIGS. 4A and 4B illustrate the deposition of the underfill 120 material over a portion of the wafer 100. As shown in FIG. 4A, the underfill 120 may be blanket deposited over the surface of the GaN layers 104. In one embodiment, the underfill 120 is patterned, e.g., using stencil printing or mesh screen-printing, so that areas 122, such as area where the LED dies are to be separated, have no underfill 120. For example, the material may be deposited in the form of a viscous paste using, e.g., stencil printing techniques. Areas where underfill is not desired, e.g., the areas around the LEDs where there is wire bonding, are protected by a mask. Openings in the mask allow the underfill material to be deposited in desired areas. After deposition, e.g., by screen printing, the underfill layer is cured at low temperature, e.g., 120°-130° C., until it is sufficiently hard to be polished. As shown in FIG. 4B, the underfill 120 is then polished back until the metal connection, i.e., bumps 110, are exposed. In one embodiment, the underfill 120 has a final thickness of 30 μm.

Figure 2C:
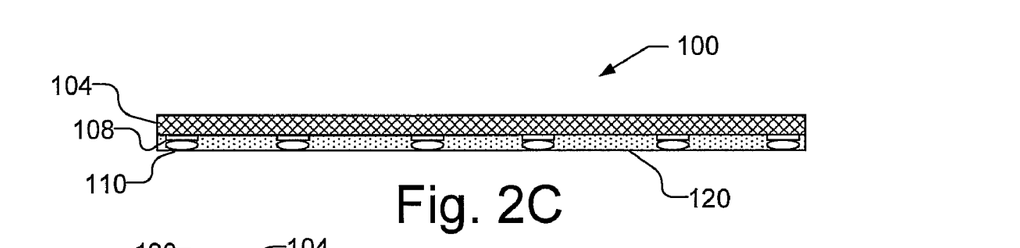

The underfill 120 advantageously serves as a support layer for the GaN layers 104 and, accordingly, the growth substrate 102 can be removed, as illustrated in FIG. 2C. The substrate 102 can be removed, e.g., by laser lift-off using an excimer laser beam that is transmitted through the transparent sapphire substrate 102 and evaporates a top layer of the n-GaN layer 104n. The removal of the substrate 102 produces tremendous pressure at the substrate/n-GaN layer 104n interface. The pressure forces the substrate 102 off the n-GaN layer 104n, and the substrate 102 is removed. The support provided by the underfill 120 prevents the high pressure during the substrate lift-off from fracturing the thin brittle LED layers 104. Additionally, if desired, the exposed n layer 104n (shown in FIG. 3) may be roughened for increasing light extraction, e.g., using photo-electro-chemical etching, or by small scale imprinting or grinding. Alternatively, roughening can include forming prisms or other optical elements on the surface for increased light extraction and improved control of the radiation pattern.

Figure 2D:
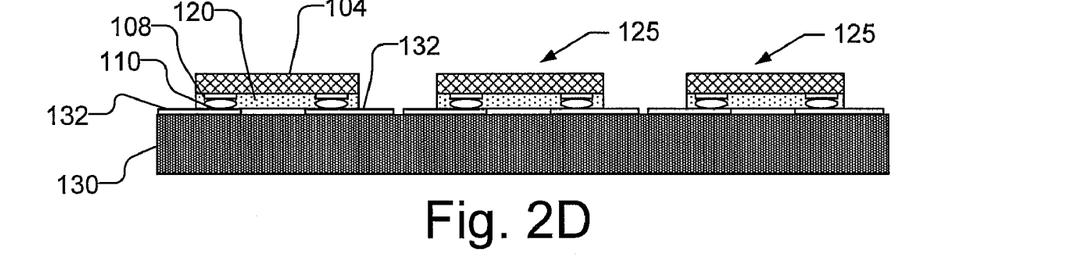

After the substrate is removed, the GaN layers 104 with the underfill 120 are scribed and separated into individual LED elements. The scribing and separation may be accomplished using, e.g., a saw that uses the areas 122 in the underfill 120 as a guide. Alternatively, a laser scribe process may be used. Prior to separating, the wafer of LEDs is adhered to a stretchable plastic sheet, and after the wafer is broken along the scribe lines, the sheet is stretched to separate the dies while the dies remain adhered to the stretchable sheet. An automatic pick and place device then removes each die 125 from the sheet, and mounts the die 125 on a submount 130 as illustrated in FIG. 2D. The bonding metal, i.e., bumps 110 on the LED dies 125 are ultrasonically or thermosonically welded directly to corresponding bonding metal patterns 132 on the submount 130, which may be, e.g., gold or other appropriate material. The submount 130 may be formed of silicon or a ceramic insulator. If the submount 130 is silicon, an oxide layer may insulate the metal pattern on the submount surface from the silicon, or different schemes of ion implantation can be realized for added functionality such as Zener diodes for electro-discharge protection. If the submount is a ceramic instead of silicon, the metal patterns can be directly formed on the ceramic surfaces.

Figure 2E:
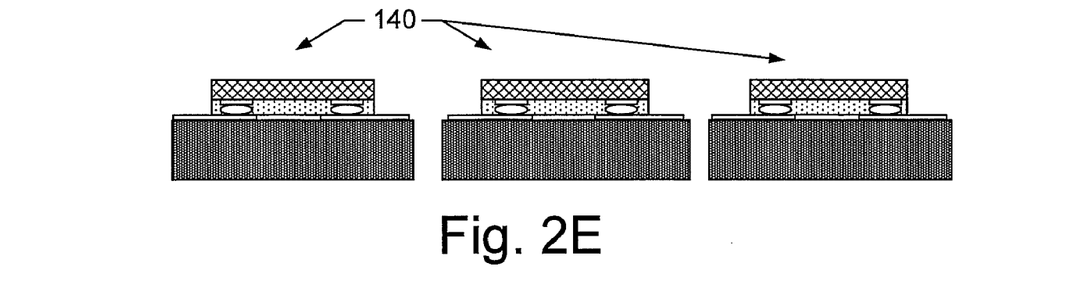

An ultrasonic transducer (thermosonic metal-to-metal interdiffusion process) may be used to apply a downward pressure to the dies 125 and rapidly vibrates the dies 125 with respect to the submount 130 so that the atoms from the opposing bonding metals merge to create an electrical and mechanical connection between the die 125 and the submount 130. Other methods for LED die-to-submount interconnection can also be used, such as using a soldering layer. During die attach process, e.g., with an Au—Au interconnect, the substrate temperature is maintained above (e.g., 40-50° C.) the glass transition temperature Tg, which causes the underfill material to be in the elastic stage to soften and comply with the LEDs and to prevent the formation of voids. Subsequently, the underfill layer is permitted to cure at approximately the glass transition temperature, e.g., 200° C., for 1-2 hours in order to harden. The submount 130 can then be scribed and singulated to form LEDs 140 as illustrated in FIG. 2E.

Figure 5A:
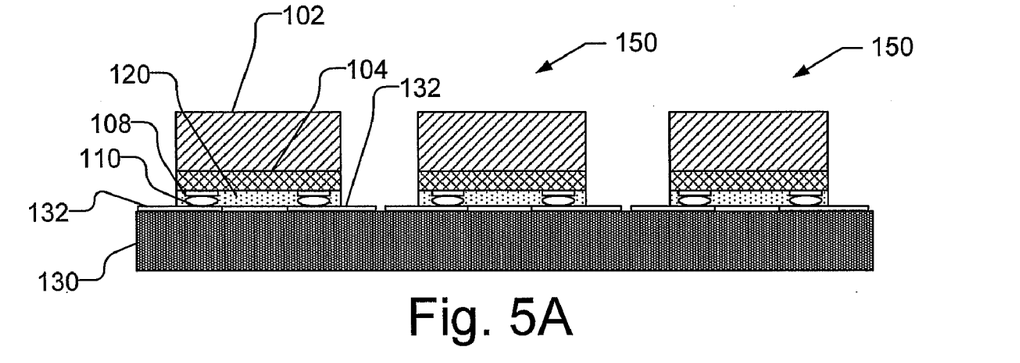
FIGS. 5A-5C are simplified cross-sectional views of mounting LEDs to a submount and removing the growth substrate after the LEDs are mounted to the submount.
Figure 5B:
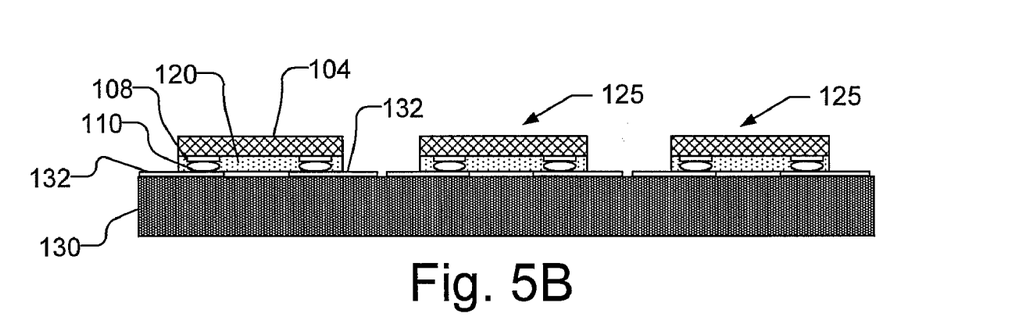
Figure 5C:
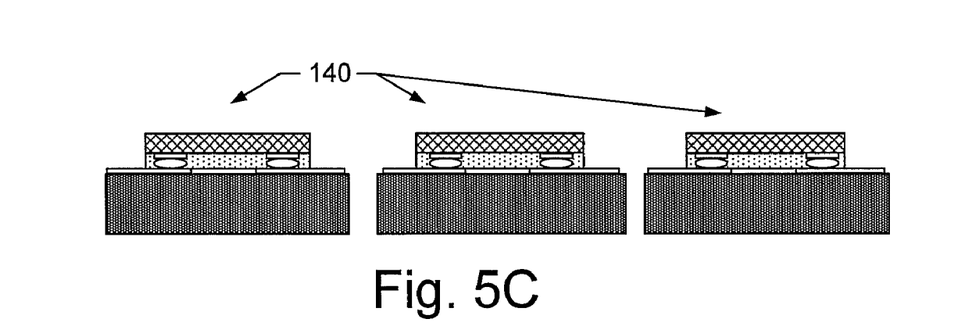

In another embodiment, the growth substrate 102 is not removed until after the wafer is separated into separate dies and mounted to the submount 130, as illustrated in FIGS. 5A, 5B, and 5C. As shown in FIG. 5A, the sapphire substrate 102 with LED GaN layers 104 are scribed and separated into individual dies 150. The scribing and separation may be accomplished using, e.g., a saw that cuts through the sapphire substrate 102 using areas 122 in the underfill 120 as a guide. The separate dies 150 are then mounted to the submount 130, as described above. Once the dies 150 are mounted to the submount 130, the sapphire substrate 102 can be lifted-off described above and as illustrated in FIG. 5B. The submount 130 is then singulated to form LEDs 140, as illustrated in FIG. 5C.

In another embodiment, the underfill may be deposited on the submount instead of the GaN layers. FIGS. 6A-6E are simplified cross-sectional views of a process of mounting GaN LEDs to a submount with an underfill coating.

Figures 6A, 6B:
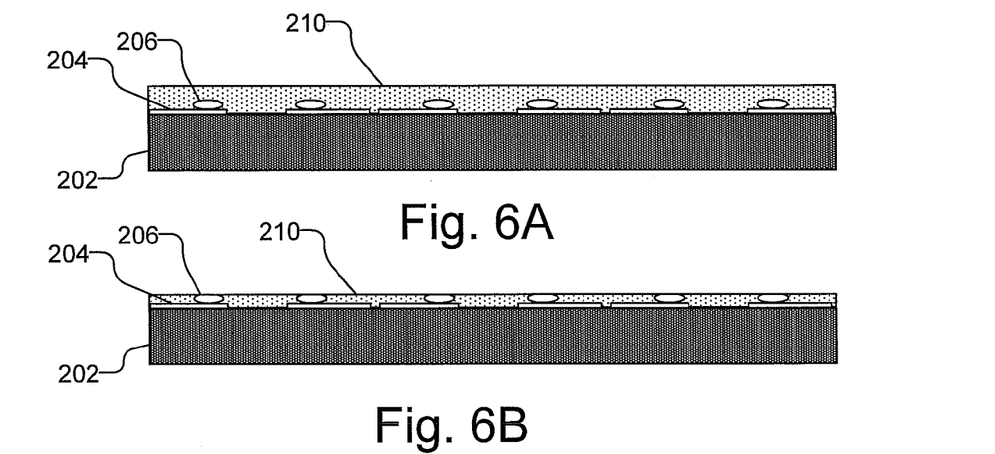
FIGS. 6A-6E are simplified cross-sectional views of a process of mounting LEDs to a submount that has an underfill coating.

FIG. 6A illustrates a portion of a submount 202 with bonding metal patterns 204 with bumps 206. By way of example, a silicon submount 202 with Au bonding metal patterns 204 and Au bumps 206 may be used. Alternatively, other materials may be used if desired. An underfill layer 210 is deposited over submount 202, bonding metal patterns 204 and bumps 206. As discussed above, the underfill layer 210 may be patterned, e.g., using stencil printing or mesh screen-printing, so that areas, such as area where the LED dies are to be separated, have no underfill material. Because the underfill 210 is applied prior to bonding LEDs to the submount, any suitable material may be used for the underfill 210 without depending on the flow characteristics that are needed in the case of traditional underfill. For example, a polymer polyimide based materials, which have high glass transition temperature, may be used as the underfill layer 210. Such materials will help the device withstand high temperature/high current condition without deformation of thin LEDs. The underfill material should have B-stage cure properties in order to adhere to both LED and support wafer surfaces. Moreover, an inorganic dielectric material may be used if desired. As illustrated in FIG. 6B, the underfill layer 210 is polished back until the metal connection, i.e., bumps 206, are exposed.

Figure 6C:
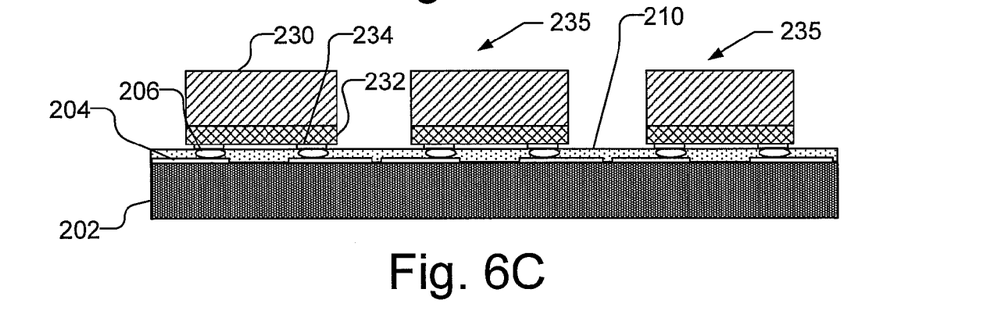
Figure 6D:
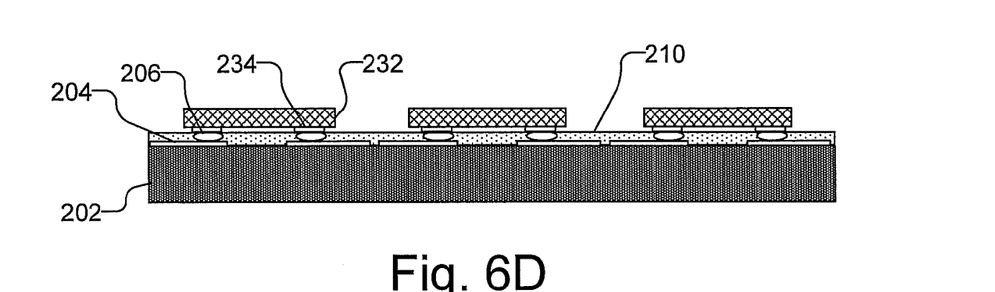
Figure 6E:
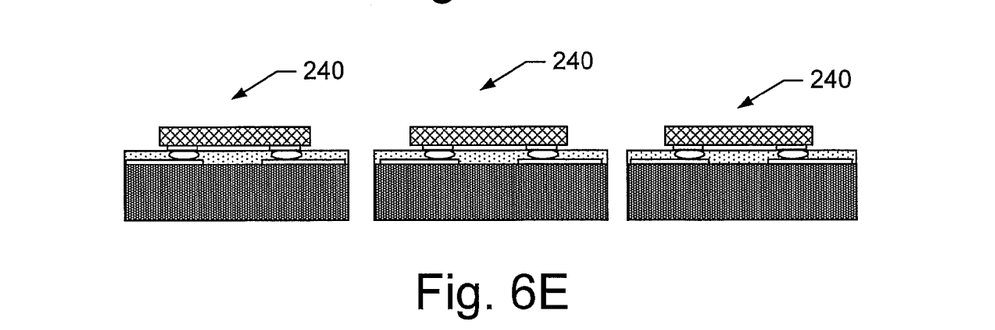

A growth substrate 230 with an LED GaN layer 232 and contacts 234 is separated into separate LED dies 235, which are then mounted on the submount 202 with underfill layer 210 as illustrated in FIG. 6C. The contacts on the LED dies 234 are ultrasonically or thermosonically welded directly to corresponding the bonding bumps 206 on the submount 130, as described above. Once mounted, the growth substrate 230 is removed, e.g., using a laser lift-off process, resulting in the structure illustrated shown in FIG. 6D. The submount 202 is then singulated to form LEDs 240, as illustrated in FIG. 6E.

FIGS. 7A-7D illustrate wafer level LEDs with a patterned underfill layer that are mounted to a submount in accordance with another embodiment.

Figure 7A:
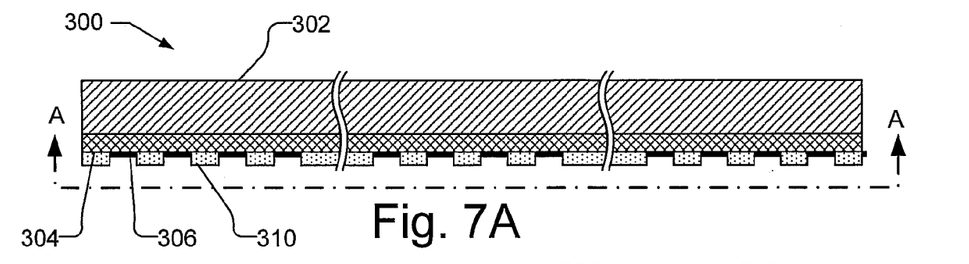
FIGS. 7A-7D illustrate another embodiment in which wafer level LEDs with a patterned underfill layer are mounted to a submount.
Figure 7B:
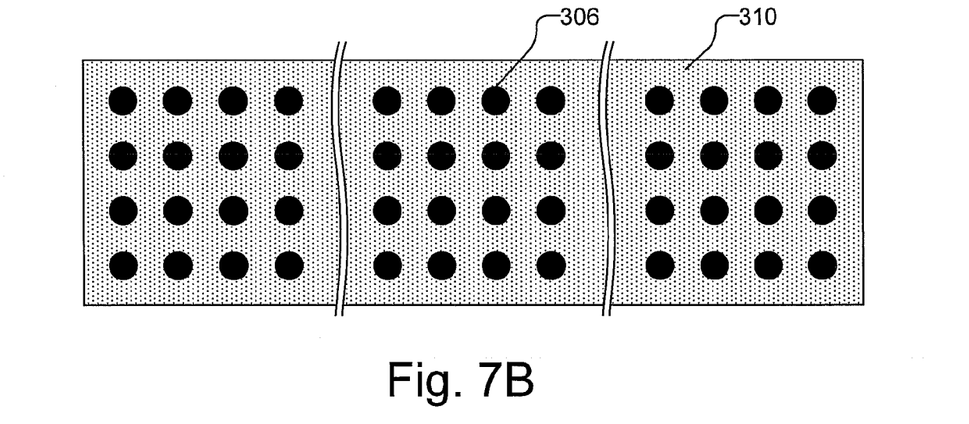

FIG. 7A is a simplified cross-sectional view of portions of wafer level LEDs 300 with a patterned underfill layer 310 and FIG. 7B is a plan view of the bottom surface of the wafer level LEDs 300 along line AA shown in FIG. 7A. The wafer level LEDs 300 include a growth substrate 302 along with LED layers 304 and contacts 306. The underfill layer 310 is deposited, e.g., using stencil printing or mesh screen-printing to form a pattern that exposes the contacts 306 on the bottom surface of the LED layers 304 and cured. The underfill pattern matches the pattern of contacts 322 that are present on the submount 320, as can be seen in FIG. 7C so that only the areas where the LEDs will be attached are exposed.

Figure 7C:
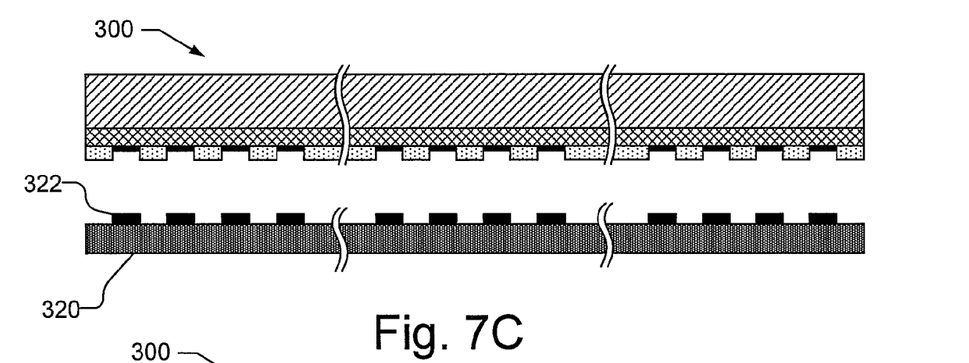
Figure 7D:
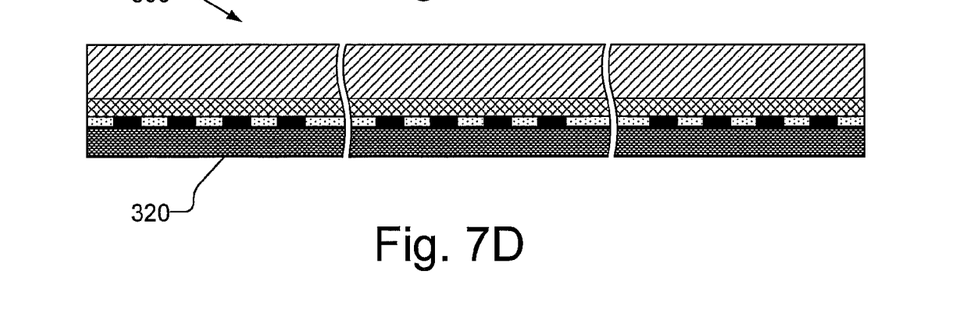

As illustrated in FIGS. 7C and 7D, the wafer level LEDs 300 are mounted at the wafer level with a submount 320 with contacts 322. The waver level LEDs 300 are mounted to the submount 320, e.g. ultrasonically or thermosonically, to bond the contacts 306 on the LED layers 304 with the contacts 322 on the submount 320, as described above. The growth substrate 302 can then be lift-off, e.g., using a laser lift-off process, and the LEDs singulated into individual dies.

Figure 8A:
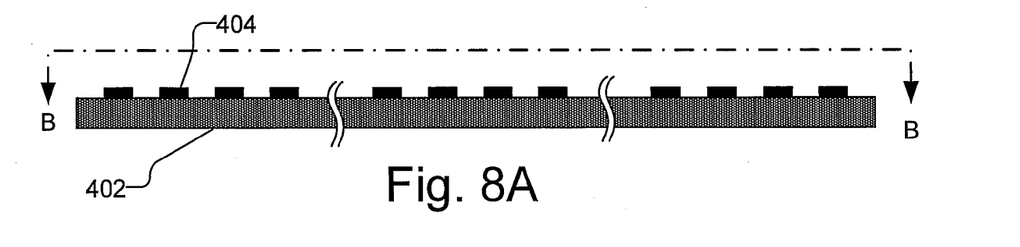
FIGS. 8A-8G illustrate another embodiment in which individual LED dies are mounted to a submount on which an underfill layer has been deposited.
Figure 8B:
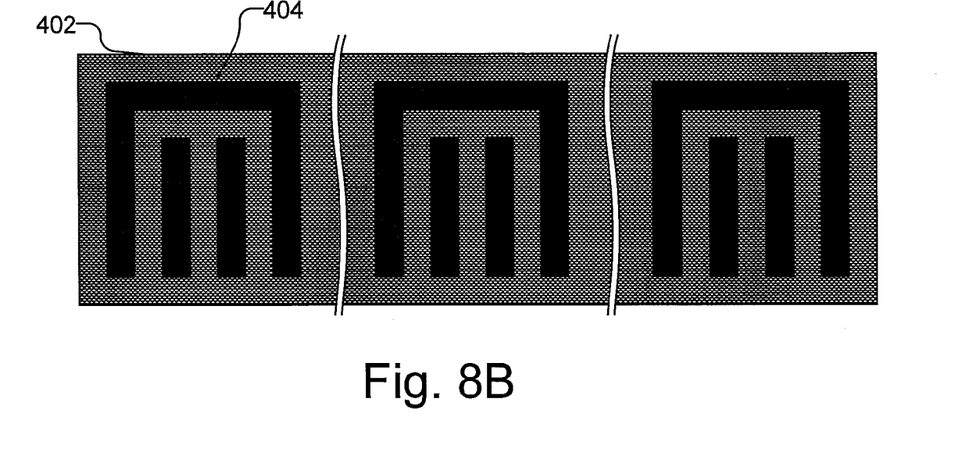
Figure 8C:
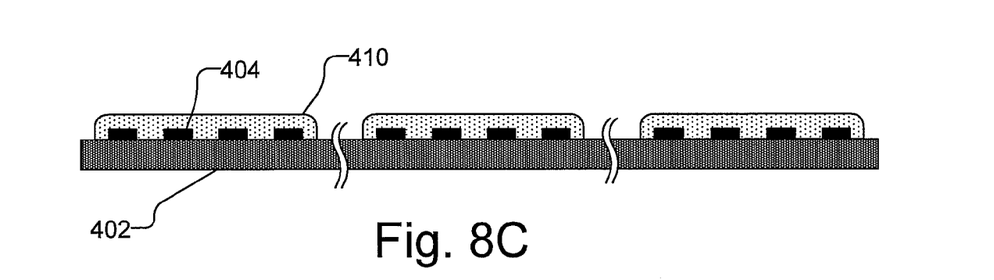
Figure 8D:
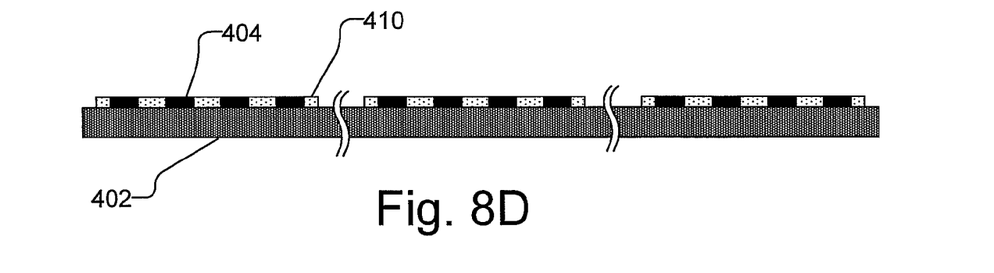
Figure 8E:
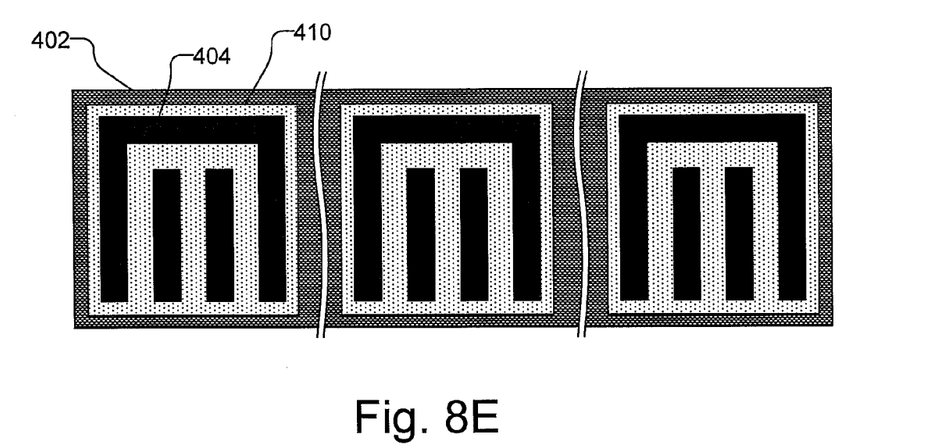

FIGS. 8A-8G illustrate another embodiment in which individual LED dies are mounted to a submount on which an underfill layer has been deposited. FIG. 8A is a simplified cross-sectional view of portions of a submount 402 with contacts 404. FIG. 8B is a plan view of the top surface of the submount 402 along line BB shown in FIG. 8A. As illustrated in FIG. 8C, an underfill layer 410 is deposited over the submount 402 and in particular is patterned to cover the contacts 404. Once the underfill layer 410 cures, the underfill layer 410 is polished back to expose the contacts 404, as illustrated in FIG. 8D and FIG. 8E, which illustrates another plan view of the submount 402.

Figure 8F:
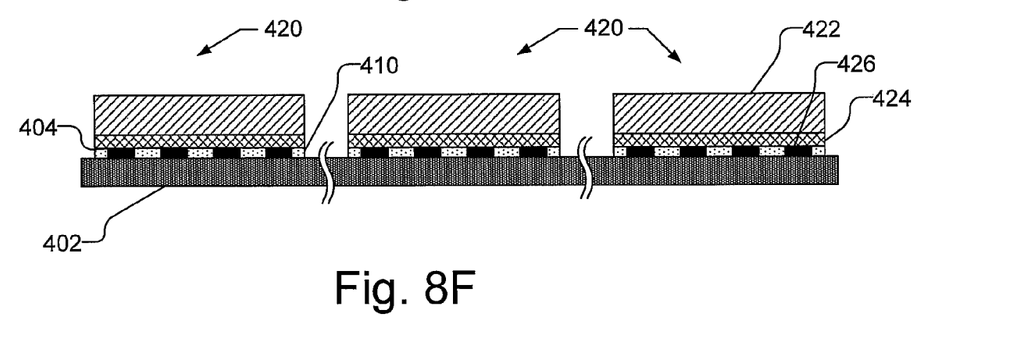
Figure 8G:
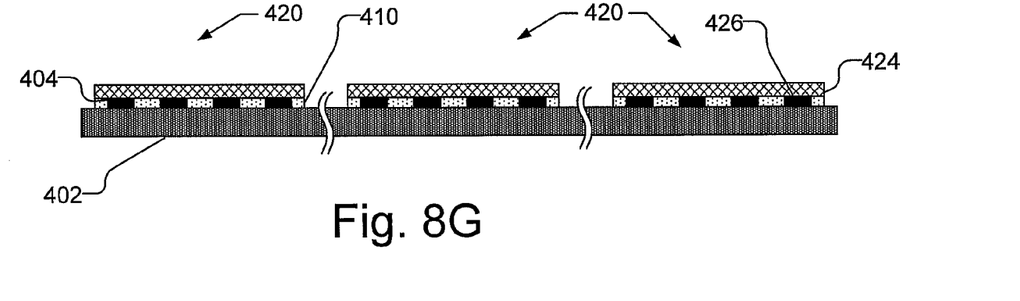

LED dies 420, each of which includes a growth substrate 422, LED layers 424 and contacts 426 on the bottom surface of the LED layers 424 are then individually mounted to the submount 402, as illustrated in FIG. 8F. Once mounted, the growth substrate 422 can be lifted off, as illustrated in FIG. 8G, and the submount 402 can be singulated to form individual LED elements as described above.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A method of fabricating a light emitting diode (LED) structure comprising:
    forming LED layers including an n-type layer, an active layer, and a p-type layer over a growth substrate;
    forming metal contacts on a bottom surface of the LED layers;
    depositing an underfill layer on the bottom surface of the LED layers;
    removing the growth substrate from the LED layers; wherein the underfill layer is the primary support for the LED layer and
    after removing the growth substrate, mounting the LED layers to a submount, wherein the submount has metal contacts on a top surface,
    wherein the metal contacts on the bottom surface of the LED layers are in contact with the metal contacts on the top surface of the submount and the underfill layer between the bottom surface of the LED layers and the top surface of the submount.

2. The method of claim 1, further comprising separating the LED layers into individual dies before mounting the LED layers to the submount.

3. The method of claim 1, further comprising singulating the LED layers mounted to the submount to form a plurality of individual elements.

4. The method of claim 1, wherein depositing an underfill layer on the bottom surface of the LED layers comprises patterning the underfill layer on the bottom surface of the LED layers.

5. The method of claim 4, wherein the underfill layer is deposited using one of stencil printing and mesh screen printing to pattern the underfill layer.

6. The method of claim 1, wherein depositing an underfill layer on the bottom surface of the LED layers comprises depositing the underfill layer over the metal contacts on the bottom surface of the LED layers and polishing the underfill layer back until at least a portion of the metal contacts on the bottom surface of the LED layers are exposed.

7. The method of claim 1, wherein the underfill layer comprises a polyimide based material.

8. A method of fabricating a light emitting diode (LED) structure comprising:
    forming LED layers including an n-type layer, an active layer, and a p-type layer over a growth substrate;
    forming metal contacts on a bottom surface of the LED layers;
    depositing a patterned underfill layer on at least one of the bottom surface of the LED layers and the top surface of the submount;
    removing the growth substrate from the LED layers; wherein the underfill layer is the primary support for the LED layer and
    after removing the growth substrate, mounting the LED layers to a submount, wherein the submount has metal contacts on a top surface,
    wherein the metal contacts on the bottom surface of the LED layers are in contact with the metal contacts on the top surface of the submount and the underfill layer between the bottom surface of the LED layers and the top surface of the submount.

9. The method of claim 8, wherein the underfill layer is deposited using one of stencil printing and mesh screen printing to pattern the underfill layer.

10. The method of claim 8, further comprising separating the LED layer into individual dies before mounting the LED layers to the submount.

11. The method of claim 8, further comprising singulating the LED layers mounted to the submount to form a plurality of individual elements.

12. The method of claim 8, wherein the underfill layer comprises a polyimide based material.

13. A method of fabricating a light emitting diode (LED) structure comprising:
    forming LED layers including an n-type layer, an active layer, and a p-type layer over a growth substrate;
    forming metal contacts on a bottom surface of the LED layers;
    depositing an underfill layer on the bottom surface of the LED layers, the underfill layer covering the metal contacts associated with the bottom surface of the LED layers;
    polishing the underfill layer back until at least a portion of the covered metal contacts are exposed;
    removing the growth substrate from the LED layers wherein the underfill layer is the primary support for the LED layer; and
    after removing the growth substrate, mounting the LED layers to a submount, wherein the submount has metal contacts on a top surface, wherein the metal contacts on the bottom surface of the LED layers are in contact with the metal contacts on the top surface of the submount and the underfill layer between the bottom surface of the LED layers and the top surface of the submount.

14. The method of claim 13, further comprising separating the LED layers into individual dies before mounting the LED layers to the submount.

15. The method of claim 13, further comprising singulating the LED layers mounted to the submount to form a plurality of individual elements.

16. The method of claim 13, wherein depositing an underfill layer on the bottom surface of the LED layers comprises patterning the underfill layer on the bottom surface of the LED layers.

17. The method of claim 16, wherein the underfill layer is deposited using one of stencil printing and mesh screen printing to pattern the underfill layer.

18. The method of claim 13, wherein the underfill layer comprises a polyimide based material.

* * * * *